(12) United States Patent
Ren et al.

(10) Patent No.: US 8,691,019 B2
(45) Date of Patent: Apr. 8, 2014

(54) PROCESS FOR CLEANING A COMPOUND SEMICONDUCTOR WAFER

(75) Inventors: Diansheng Ren, Beijing (CN); Qinghui Liu, Beijing (CN)

(73) Assignee: Beijing Tongmei Xtal Technology Co., Ltd., Beijing (CN)

( * ) Notice: Subject to any disclaimer, the term of this patent is extended or adjusted under 35 U.S.C. 154(b) by 0 days.

(21) Appl. No.: 13/879,173

(22) PCT Filed: Oct. 14, 2011

(86) PCT No.: PCT/CN2011/001721
§ 371 (c)(1),
(2), (4) Date: Jun. 24, 2013

(87) PCT Pub. No.: WO2012/048534
PCT Pub. Date: Apr. 19, 2012

(65) Prior Publication Data
US 2013/0276824 A1    Oct. 24, 2013

(30) Foreign Application Priority Data

Oct. 15, 2010    (CN) .......................... 2010 1 0513860

(51) Int. Cl.
*C23G 1/02* (2006.01)

(52) U.S. Cl.
USPC .......... 134/3; 134/2; 134/26; 134/27; 134/28; 134/29; 134/30; 134/34; 134/36; 134/41; 134/42; 438/714; 438/908; 216/83; 216/96; 216/100; 252/79.1

(58) Field of Classification Search
USPC ......... 134/2, 3, 26, 27, 28, 29, 30, 34, 36, 41, 134/42; 438/714, 908; 216/83, 96, 100; 252/79.1
See application file for complete search history.

(56) References Cited

U.S. PATENT DOCUMENTS

| 4,736,760 A | * | 4/1988 | Coberly et al. | ............... 134/134 |
| 7,456,113 B2 | * | 11/2008 | Rayandayan et al. | ........ 438/745 |
| 7,737,043 B2 | | 6/2010 | Nishiura et al. | |
| 2003/0102528 A1 | * | 6/2003 | Vyvoda et al. | ................ 257/618 |

FOREIGN PATENT DOCUMENTS

| CN | 1787178 | * | 6/2006 |
| CN | 1787178 A | | 6/2006 |
| CN | 101075570 A | | 11/2007 |
| CN | 101661869 A | | 3/2010 |
| CN | 102064090 | * | 5/2011 |
| CN | 102064090 A | | 5/2011 |
| CN | 102110594 | * | 5/2011 |
| JP | 2000-290693 A | | 10/2000 |

OTHER PUBLICATIONS

Merriam Webster Dictionary, www.merriam-webster.com, Aug. 28, 2013, p. 1 only, definition of room temperature.*

* cited by examiner

*Primary Examiner* — Bibi Carrillo
(74) *Attorney, Agent, or Firm* — Hultquist, PLLC; Steven J. Hultquist; Mary B. Grant

(57) ABSTRACT

A process for cleaning a compound semiconductor wafer; the compound semiconductor wafer comprises, taking gallium arsenide (GaAs) as a representative, a group III-V compound semiconductor wafer. The process comprises the following steps: 1) treating the wafer with a mixture of dilute ammonia, hydrogen peroxide and water at a temperature not higher than 20° C.; 2) washing the wafer with deionized water; 3) treating the wafer with an oxidant; 4) washing the wafer with deionized water; 5) treating the wafer with a dilute acid solution or a dilute alkali solution; 6) washing the wafer with deionized water; and 7) drying the resulting wafer. The process can improve the cleanliness, micro-roughness and uniformity of the wafer surface.

15 Claims, No Drawings

PROCESS FOR CLEANING A COMPOUND SEMICONDUCTOR WAFER

CROSS-REFERENCE TO RELATED APPLICATIONS

This application is a U.S. national phase under the provisions of 35 U.S.C. §371 of International patent application No. PCT/CN11/01721 filed Oct. 14, 2011, which in turn claims priority of Chinese Patent Application No. 201010513860.7 filed Oct. 15, 2010. The disclosures of such international patent application and Chinese priority patent application are hereby incorporated herein by reference in their respective entireties, for all purposes.

TECHNICAL FIELD

The present invention relates to a process for cleaning a compound semiconductor wafer, especially for cleaning a group III-V compound, such as GaAs, semiconductor wafer.

BACKGROUND ART

Group III-V compound (i.e. compound consisting of elements of groups III and V) semiconductor materials, with gallium arsenide (GaAs) as a representative, find wide use in the fields of satellite communication, microwave devices, laser devices and light-emitting diodes, owing to their unique electronic properties. In the production of devices like Heterojunction Bipolar Transistors (HBT), High Electron Mobility Transistors (HEMT) and LED, substrates with high-quality surfaces are required for the growth of quantum well structures on the surfaces by molecular beam epitaxy (MBE) technology or metal organic compound vapor deposit (MOCVD) technology. With the manufacturing processes of semiconductor devices improving, the devices are getting smaller and smaller in size, while becoming more and more efficient in use; the devices in terms of reliability and stability rely more and more on the quality of the semiconductor substrate, especially the quality of the wafer surface.

Cleaning is the last and the key operation to get a high quality surface in the wafer manufacturing process; it is intended to remove various residues derived from the preceding operations, so as to get a fresh clean surface, serving as the basis of subsequent operations. For now, the compound semiconductors are still cleaned mostly by the established method for cleaning monocrystal silicon wafer developed by RCA (Radio Corporation of America) in 1970, i.e. cleaned by using a mixture of ammonia, hydrogen peroxide and water (APM or SC-1) and a mixture of hydrochloric acid, hydrogen peroxide and water (HPM or SC-2), aided with various physical effects and mechanical operations.

Gallium Arsenide, a binary compound semiconductor, has physical and chemical properties widely different from silicon monocrystal. The surface of Gallium Arsenide wafer is formed of gallium atoms and arsenic atoms. Owing to different chemical properties of gallium and arsenic, its surface reactivity is different: the native oxide layer thereof consists of gallium dioxide ($Ga_2O_3$), arsenic trioxide ($As_2O_3$), arsenic pentoxide ($As_2O_5$) and a small amount of elemental arsenic (As). The conventionally used SC-1 and SC-2 have very obvious corrosive effect on gallium arsenide, and thus if the method for cleaning silicon wafer is directly adopted without modification, phenomena like rough surface (fogging), non-uniform corrosion, and concentration of foreign particles would easily occur. Such surface will bring about problems such as abnormal growth, anomaly structures and increased defects of epitaxy layers in the subsequent epitaxy application.

SUMMARY OF THE INVENTION

It is an object of the invention to provide a process for cleaning a group III-V compound semiconductor wafer, comprising:
1. treating the wafer with a mixture of dilute ammonia, hydrogen peroxide and water at a temperature not higher than 20° C.;
2. washing the wafer with deionized water;
3. treating the wafer with an oxidant;
4. washing the wafer with deionized water;
5. treating the wafer with a dilute acid solution or a dilute alkali solution;
6. washing the wafer with deionized water; and
7. drying the resulting wafer.

The process according to the present invention can improve the cleanliness, micro-roughness and uniformity of the wafer surface.

MODE FOR CARRYING OUT THE INVENTION

The present invention provides a process for cleaning a group III-V compound semiconductor wafer, comprising:
1. treating the wafer with a mixture of dilute ammonia, hydrogen peroxide and water at a temperature not higher than 20° C.;
2. washing the wafer with deionized water;
3. treating the wafer with an oxidant;
4. washing the wafer with deionized water;
5. treating the wafer with a dilute acid solution or a dilute alkali solution;
6. washing the wafer with deionized water; and
7. drying the resulting wafer.

In a specific preferred embodiment, the process comprises the following steps:
1. treating the wafer with a mixture of dilute ammonia, hydrogen peroxide and water at a temperature not higher than 20° C.;
2. washing the wafer with deionized water;
3. treating the wafer with an oxidant at a temperature not higher than 30° C.;
4. washing the wafer with deionized water;
5. treating the wafer with a dilute acid solution or a dilute alkali solution at a temperature not higher than 30° C.;
6. washing the wafer with deionized water; and
7. drying the resulting wafer.

In the present invention, unless otherwise specified, all the concentration percentages are based on weight. The concentrations of ammonia, hydrogen peroxide, oxidant, acid and alkali are all calculated based on their pure substances.

For the sake of convenience and simplicity, the resistivity of the deionized water is the value measured at 25° C.

In the first step of the process according to the present invention (treating the wafer with a mixture of dilute ammonia, hydrogen peroxide and water at a temperature not higher than 20° C.), the treatment procedure is preferentially performed at a temperature not higher than 20° C., preferably not higher than 15° C., and more preferably from 5° C. to 15° C. The treatment usually lasts 2 to 25 minutes, preferably 3 to 20 minutes and more preferably 5 to 18 minutes. In said mixture of dilute ammonia, hydrogen peroxide and water, the ammonia and hydrogen peroxide usually account for (in weight percentages) 0.2-10.0% and 0.2-3.0% respectively, preferably 0.2-5.0% and 0.2-2.5%, and further preferably 0.25-3.5% and 0.25-2.0% respectively. The present invention advantageously slows down the corrosion rate of the wafer surface by selecting the concentrations of ammonia and hydrogen peroxide. Besides, the use of low temperature can further decrease the corrosion of the wafer surface by the solution, thereby improving the wafer surface in terms of micro-toughness. Moreover, the treatment procedure can optionally use megasonic wave, which can further improve removing the foreign particles, thus making the wafer surface uniform and clean. In this step, the megasonic wave has a wavelength ranging from 480 to 1,000 KHz, and preferably from 600 to 850 KHz. The employed megasonic wave has an energy density, based on the area of a single-side of the wafer, of 0.001 to 0.003 $W/mm^2$, and preferably 0.0012 to 0.0022 $W/mm^2$. The megasonic treatment duration may be the same as, or longer or shorter than that of treating the wafer with the mixture of dilute ammonia, hydrogen peroxide and water, for example, treating the wafer with megasonic wave on and off during the treatment with the mixture of dilute ammonia, hydrogen perooxide and water.

In the third step of the process according to the present invention (treating the wafer with an oxidant), the wafer is usually treated with an oxidant at a temperature not higher than 30° C., preferably not higher than 20° C., and more preferably from 5° C. to 20° C., so that a uniform oxide layer is formed on the wafer surface, which further remedies the non-uniformity caused in the preceding step. The oxidant employed in this step can be any conventional oxidant, such as, hydrogen peroxide, organic peroxide (for example, benzoyl peroxide), water containing ozone or the like. The oxidization, in this step, preferably proceeds in solutions, for example, in a solution of 10% to 30% hydrogen peroxide. The treatment duration usually is 1 to 45 minutes, preferably 3 to 30 minutes, and more preferably 5 to 15 minutes. The treatment may also proceed partially or totally aided with megasonic wave. Preferably, the megasonic wave has a wavelength ranging from 480 to 1,000 KHz, and more preferably from 600 to 850 KHz. The employed megasonic wave has an energy density, based on the area of a single-side of the wafer, of 0.001 to 0.003 $W/mm^2$, preferably 0.0012 to 0.0022 $W/mm^2$.

In the fifth step of the process according to the present invention (treating the wafer with a dilute acid solution or a dilute alkali solution), the oxide layer formed in the previous steps is dissolved in a dilute acid solution or a dilute alkali solution, based on the solubility of oxide of the gallium arsenide surface in acid solution or alkali solution, at a temperature not higher than 30° C., preferably not higher than 20° C., and more preferably between 5 and 20° C., so that the fresh gallium arsenide surface is exposed. Said dilute acid solution or dilute alkali solution can be a dilute solution of hydrochloric acid, hydrofluoric acid or nitric acid having a concentration of 0.1-12%, and preferably 0.5-8%, or a dilute solution of ammonia, sodium hydroxide or potassium hydroxide having a concentration of 0.5-20%, and preferably 1-15%. The treatment duration usually is 1 to 45 minutes, preferably 3 to 30 minutes, and more preferably 5 to 15 minutes. The treatment may also proceed partially or totally aided with megasonic wave. Preferably, the megasonic wave has a wavelength ranging from 480 to 1,000 KHz, and preferably from 600 to 850 KHz. The employed megasonic wave has an energy density, based on the area of a single-side of the wafer, of 0.001 to 0.003 $W/mm^2$, preferably 0.0012 to 0.0022 $W/mm^2$.

In the second, fourth and sixth steps which involve washing the wafer with deionized water, each procedure is preferably performed at a relatively low temperature, for example, a temperature not higher than 30° C., preferably not higher than 25° C., and more preferably a temperature between 8 and 20° C. The washing duration is 1 to 15 minutes, preferably 3 to 10 minutes. The deionized water used, for example, has a resistivity not lower than $1.5\times10^7$ Ω·cm, and preferably not lower than $1.75\times10^7$ Ω·cm. The treatment may also proceed partially or totally aided with megasonic wave. Preferably, the megasonic wave has a wavelength ranging from 480 to 1,000 KHz, and preferably from 600 to 850 KHz. The employed megasonic wave has an energy density, based on the area of a single-side of the wafer, of 0.001 to 0.003 $W/mm^2$, preferably 0.0012 to 0.0022 $W/mm^2$.

In the seventh step of the process according to the present invention (drying the resulting wafer), the wafer can be dried in air or in an inert atmosphere (nitrogen and the like), or in vacuum.

The process according to the present invention is particularly suitable for cleaning group III-V compound semiconductor wafers, especially gallium arsenide semiconductor wafers.

In a preferred embodiment of the process according to the present invention, other additives like surfactant, HF, chelating agents and the like may be added into the mixture in the first step, so as to steadily remove the particles on the wafer surface and keep the metal from adhering to the surface.

The process according to the present invention is characterized in that the use the mixture of dilute ammonia, hydrogen peroxide and water, accompanied by the action of low temperature and optional megasonic waves, serves to remove major residues and foreign particles, thereby decreasing excessive corrosion of the wafer surface; in addition, the wafer surface can be more uniform through the process of re-oxidation after the corrosion.

The following examples are intended to illustrate the invention and shall not be understood in any way as limiting the scope of the invention.

EXAMPLES

Instruments: Megasonic generator (PCT, US, 9400 type)
Wet-cleaning stand (including an etching tank and a rinsing tank from which rinsing water can be discharged in a quick manner)
Rotary wafer drier (Semitool, US, 101 type SRD)
Wafer quality testing means:
Yamada bright light (light intensity is more than 100,000 Lux);
Wafer surface analyzer (KLA-TENCOR, US, 6220 type); and
Atomic Force Microscope (AFM) (Digital Instrument, US, NanoScope IIIa type) (vertical resolution of 0.03 nm and analysis region of 5 μm×5 μm).
Wafer to be cleaned: 150.04 mm (6 inches) gallium arsenide wafer, 650 μm thick, roughly polished and finely polished.

An examination with the bright light confirms the existence of visible particles and hazes on the wafer surface.

An examination with TENCOR 6220 confirms a number of particles larger than 0.3 μm of more than 1,000, and a haze value of 13 ppm.

An examination with Atomic Force Microscope confirms a micro-roughness of surfaces Ra of 0.18 nm.

Example 1

A wafer was dipped into a megasonized aqueous solution comprising 0.3% $NH_3$ and 1.3% $H_2O_2$ at a temperature of 10°

C. for 5 minutes, with megasonic waves (frequency of 780 KHz and energy density of 0.00125 W/mm$^2$) being applied during the whole course.

The wafer was put into the rinsing tank, and the surface thereof was washed with deionized water having a resistivity of 1.75×10$^7$ Ω·cm by means of overflow rinsing combined with spraying with quick-discharge at a temperature of 10° C. for 3 minutes, with the megasonic waves being applied during the whole course.

The washed wafer was dipped into a megasonized solution of 10% H$_2$O$_2$ at a temperature of 20° C. for 5 minutes, with the megasonic waves (frequency of 780 KHz and energy density of 0.00125 W/mm$^2$) being applied during the whole course.

Next, the wafer was put into the rinsing tank, and the surface thereof was washed with deionized water having a resistivity of 1.75×10$^7$ Ω·cm by means of overflow rinsing combined with spraying with quick-discharge at a temperature of 15° C. for 3 minutes, with the megasonic waves being applied during the whole course.

The washed wafer was dipped into a megasonized aqueous solution of 10% ammonia at a temperature of 20° C. for 5 minutes, with the megasonic waves (frequency of 780 KHz and energy density of 0.00125 W/mm$^2$) being applied during the whole course.

Next, the wafer was put into the rinsing tank, and the surface thereof was washed with deionized water having a resistivity of 1.75×10$^7$ Ω·cm by means of overflow rinsing combined with spraying with quick-discharge at a temperature of 15° C. for 3 minutes, with the megasonic waves being applied during the whole course.

The washed wafer was put into the rotary wafer drier and dried by hot nitrogen.

The surface of the dried wafer was examined with bright light, TENCOR6220, and Atomic Force Microscope.

An examination with the bright light confirms absence of visible particles and absence of hazes on the wafer surface.

An examination with TENCOR 6220 confirms a number of 38 of particles larger than 0.3 μm, and a haze value of 0.3 ppm.

An examination with Atomic Force Microscope confirms a micro roughness of surfaces Ra of 0.15 nm.

Example 2

A wafer was dipped into an aqueous solution comprising 0.5% NH$_3$ and 0.3% H$_2$O$_2$ at a temperature of 20° C. for 10 minutes.

The wafer was put into the rinsing tank, and the surface thereof was washed with deionized water having a resistivity of 1.75×10$^7$ Ω·cm by means of overflow rinsing combined with spraying with quick-discharge at a temperature of 20° C. for 5 minutes.

The washed wafer was dipped into a saturated aqueous solution of benzoyl peroxide at a temperature of 20° C. for 10 minutes.

Next, the wafer was put into the rinsing tank, and the surface thereof was washed with deionized water having a resistivity of 1.75×10$^7$ Ω·cm by means of overflow rinsing combined with spraying with quick-discharge at a temperature of 20° C. for 5 minutes, with the megasonic waves being applied during the whole course.

The washed wafer was dipped into an aqueous solution of 5% HCl at a temperature of 20° C. for 10 minutes.

Next, the wafer was put into the rinsing tank, and the surface thereof was washed with deionized water having a resistivity of 1.75×10$^7$ Ω·cm by means of overflow rinsing combined with spraying with quick-discharge at a temperature of 20° C. for 3 minutes, with the megasonic waves being applied during the whole course.

The washed wafer was put into the rotary wafer drier and dried by hot nitrogen.

The surface of the dried wafer was examined with bright light, TENCOR6220, and Atomic Force Microscope.

An examination with the bright light confirms absence of visible particles and absence of hazes on the wafer surface.

An examination with TENCOR 6220 confirms a number of 106 of particles larger than 0.3 μm, and a haze value of 3.1 ppm.

An examination with Atomic Force Microscope confirms a micro-roughness of surfaces Ra of 0.16 nm.

Example 3

A wafer was dipped into a megasonized aqueous solution comprising 3.5% NH$_3$ and 2.0% H$_2$O$_2$ at a temperature of 15° C. for 5 minutes, with megasonic waves (frequency of 700 KHz and energy density of 0.0014 W/mm$^2$) being applied during the whole course.

The wafer was put into the rinsing tank, and the surface thereof was washed with deionized water having a resistivity of 1.75×10$^7$ Ω·cm by means of overflow rinsing combined with spraying with quick-discharge at a temperature of 10° C. for 3 minutes, with the megasonic waves being applied during the whole course.

The washed wafer was dipped into a megasonized solution of 12% H$_2$O$_2$ at a temperature of 20° C. for 5 minutes, with the megasonic waves (frequency of 700 KHz and energy density of 0.0014 W/mm$^2$) being applied during the whole course.

Next, the wafer was put into the rinsing tank, and the surface thereof was washed with deionized water having a resistivity of 1.75×10$^7$ Ω·cm by means of overflow rinsing combined with spraying with quick-discharge at a temperature of 20° C. for 5 minutes, with the megasonic waves being applied during the whole course.

The washed wafer was dipped into a megasonized (frequency of 700 KHz and energy density of 0.0014 W/mm$^2$) aqueous solution of 10% ammonia at a temperature of 10° C. for 10 minutes.

Next, the wafer was put into the rinsing tank, and the surface thereof was washed with deionized water having a resistivity of 1.75×10$^7$ Ω·cm by means of overflow rinsing combined with spraying with quick-discharge at a temperature of 20° C. for 3 minutes, with the megasonic waves being applied during the whole course.

The washed wafer was put into the rotary wafer drier and dried by hot nitrogen.

The surface of the dried wafer was examined with bright light, TENCOR6220, and Atomic Force Microscope.

An examination with the bright light confirms absence of visible particles and absence of hazes on the wafer surface.

An examination with TENCOR 6220 confirms a number of 51 of particles larger than 0.3 μm, and a haze value of 3.49 ppm.

An examination with Atomic Force Microscope confirms a micro-roughness of surfaces Ra of 0.17 nm.

Example 4

A wafer was dipped into a megasonized aqueous solution comprising 0.4% NH$_3$ and 0.8% H$_2$O$_2$ at a temperature of 8° C. for 10 minutes, with megasonic waves (frequency of 680 KHz and energy density of 0.0015 W/mm$^2$) being applied during the whole course.

The wafer was put into the rinsing tank, and the surface thereof was washed with deionized water having a resistivity of $1.75 \times 10^7$ Ω·cm by means of overflow rinsing combined with spraying with quick-discharge at a temperature of 10° C. for 3 minutes, with the megasonic waves being applied during the whole course.

The washed wafer was dipped into a megasonized solution of 12% $H_2O_2$ at a temperature of 10° C. for 5 minutes, with the megasonic waves (frequency of 680 KHz and energy density of 0.0015 $W/mm^2$) being applied during the whole course.

Next, the wafer was put into the rinsing tank, and the surface thereof was washed with deionized water having a resistivity of $1.75 \times 10^7$ Ω·cm by means of overflow rinsing combined with spraying with quick-discharge at a temperature of 15° C. for 3 minutes, with the megasonic waves being applied during the whole course.

The washed wafer was dipped into a megasonized (frequency of 680 KHz and energy density of 0.0015 $W/mm^2$) aqueous solution of 12% ammonia at a temperature of 20° C. for 5 minutes.

Next, the wafer was put into the rinsing tank, and the surface thereof was washed with deionized water having a resistivity of $1.75 \times 10^7$ Ω·cm by means of overflow rinsing combined with spraying with quick-discharge at a temperature of 15° C. for 5 minutes, with the megasonic waves being applied during the whole course.

The washed wafer was put into the rotary wafer drier and dried by hot nitrogen.

The surface of the dried wafer was examined with bright light, TENCOR6220, and Atomic Force Microscope.

An examination with the bright light confirms absence of visible particles and absence of hazes on the wafer surface.

An examination with TENCOR 6220 confirms a number of 46 of particles larger than 0.3 μm, and a haze value of 0.31 ppm.

An examination with Atomic Force Microscope confirms a micro-roughness of surfaces Ra of 0.15 nm.

Example 5

A wafer was dipped into a megasonized aqueous solution comprising 0.5% $NH_3$ and 0.5% $H_2O_2$ at a temperature of 10° C. for 15 minutes, with megasonic waves (frequency of 800 KHz and energy density of 0.0014 $W/mm^2$) being applied during the whole course.

The wafer was put into the rinsing tank, and the surface thereof was washed with deionized water having a resistivity of $1.75 \times 10^7$ Ω·cm by means of overflow rinsing combined with spraying with quick-discharge at a temperature of 15° C. for 3 minutes, with the megasonic waves being applied during the whole course.

The washed wafer was dipped into a megasonized ozone water having an $O_3$ content of 2 ppm at a temperature of 15° C. for 5 minutes, with the megasonic waves (frequency of 800 KHz and energy density of 0.0014 $W/mm^2$) being applied during the whole course.

Next, the wafer was put into the rinsing tank, and the surface thereof was washed with deionized water having a resistivity of $1.75 \times 10^7$ Ω·cm by means of overflow rinsing combined with spraying with quick-discharge at a temperature of 15° C. for 3 minutes, with the megasonic waves being applied during the whole course.

The washed wafer was dipped into a megasonized (frequency of 780 KHz and energy density of 0.00125 $W/mm^2$) aqueous solution of 10% NaOH at a temperature of 20° C. for 5 minutes.

Next, the wafer was put into the rinsing tank, and the surface thereof was washed with deionized water having a resistivity of $1.75 \times 10^7$ Ω·cm by means of overflow rinsing combined with spraying with quick-discharge at a temperature of 15° C. for 3 minutes, with the megasonic waves being applied during the whole course.

The washed wafer was put into the rotary wafer drier and dried by hot nitrogen.

The surface of the dried wafer was examined with bright light, TENCOR6220, and Atomic Force Microscope.

An examination with the bright light confirms absence of visible particles and absence of hazes on the wafer surface.

An examination with TENCOR 6220 confirms a number of 45 of particles larger than 0.3 μm, and a haze value of 0.27 ppm.

An examination with Atomic Force Microscope confirms a micro-roughness of surfaces Ra of 0.14 nm.

The invention claimed is:

1. A process for cleaning a group III-V compound semiconductor wafer, comprising the sequential steps of
   1) treating the wafer with a mixture of dilute ammonia, hydrogen peroxide and water at a temperature not higher than 15° C;
   2) washing the wafer with deionized water;
   3) treating the wafer with an oxidant;
   4) washing the wafer with deionized water;
   5) treating the wafer with a dilute acid solution or a dilute alkali solution;
   6) washing the wafer with deionized water; and
   7) drying the resulting wafer.

2. The process according to claim 1, wherein the treatment duration of step 1) is 2 to 25 minutes.

3. The process according to claim 1, wherein the mixture of dilute ammonia, hydrogen peroxide and water comprises the ammonia and hydrogen peroxide in an amount of (in weight percentages) 0.2-10.0% and 0.2-3.0% respectively.

4. The process according to claim 1, wherein in step 3), the oxidant employed is hydrogen peroxide, organic peroxide or water containing ozone.

5. The process according to claim 1, wherein the treatment duration of step 3) is 1 to 45 minutes.

6. The process according to claim 1, wherein in step 5), the dilute acid solution or dilute alkali solution is a dilute solution of hydrochloric acid, hydrofluoric acid or nitric acid, or a dilute solution of ammonia, sodium hydroxide or potassium hydroxide.

7. The process according to claim 1, with all or part of steps 1) to 6) being carried out aided with megasonic wave.

8. The process according to claim 1, wherein the group III-V compound is gallium arsenide.

9. The process according to claim 1, wherein in step 1), other additives selected from the group consisting of surfactants, HF and chelating agents are added into the mixture.

10. The process according to claim 1, wherein step 1) is performed at a temperature from 5° C. to 15° C.

11. The process according to claim 1, wherein the treatment duration of step 1) is 3 to 20 minutes.

12. The process according to claim 1, wherein the treatment duration of step 1) is 5 to 18 minutes.

13. The process according to claim 1, wherein the mixture of dilute ammonia, hydrogen peroxide and water comprises the ammonia and hydrogen peroxide in an amount of (in weight percentages) 0.2-5.0% and 0.2-2.5% respectively.

14. The process according to claim 1, wherein the treatment duration of step 3) is 3 to 30 minutes.

15. The process according to claim 1, wherein the treatment duration of step 3) is 5 to 15 minutes.

\* \* \* \* \*